(12) United States Patent
Nale et al.

(10) Patent No.: US 11,837,314 B2
(45) Date of Patent: Dec. 5, 2023

(54) UNDO AND REDO OF SOFT POST PACKAGE REPAIR

(71) Applicant: SK Hynix NAND Product Solutions Corp., Rancho Cordova, CA (US)

(72) Inventors: Bill Nale, Livermore, CA (US); Kuljit Bains, Olympia, WA (US); Wei Chen, Portland, OR (US); Rajat Agarwal, Portland, OR (US)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 743 days.

(21) Appl. No.: 16/795,119

(22) Filed: Feb. 19, 2020

(65) Prior Publication Data
US 2020/0185052 A1    Jun. 11, 2020

(51) Int. Cl.
*G11C 29/44* (2006.01)
*G11C 7/10* (2006.01)
*G11C 11/406* (2006.01)
*G11C 29/00* (2006.01)

(52) U.S. Cl.
CPC .......... *G11C 29/838* (2013.01); *G11C 7/1045* (2013.01); *G11C 7/1078* (2013.01); *G11C 11/406* (2013.01); *G11C 29/44* (2013.01); *G11C 2029/4402* (2013.01)

(58) Field of Classification Search
None
See application file for complete search history.

(56) References Cited

U.S. PATENT DOCUMENTS 10,497,458 B2 * 12/2019 Wilson ................... G11C 29/70
2018/0107597 A1 *  4/2018 Jo ......................... G06F 13/1647

FOREIGN PATENT DOCUMENTS

KR    20160046502 A  *  4/2016  ............. G11C 29/04

OTHER PUBLICATIONS

"SPECTEK_4GB_DDR4_SDRAM", "Micron Technology"—(2015) (Year: 2015).*

* cited by examiner

*Primary Examiner* — April Y Blair
*Assistant Examiner* — Matthew W Wahlin
(74) *Attorney, Agent, or Firm* — HALEY GUILIANO LLP (57) ABSTRACT

An embodiment of an electronic memory apparatus may include storage media, and logic communicatively coupled to the storage media, the logic to determine if a mode is set to one of a first mode or a second mode, perform a soft post package repair in the first mode, and undo the soft post package repair in the second mode. Other embodiments are disclosed and claimed.

17 Claims, 5 Drawing Sheets

UNDO AND REDO OF SOFT POST PACKAGE REPAIR

BACKGROUND

A memory device may have faulty rows, columns, chips, banks, etc. Some faults may be temporary while other faults may be permanent. Some memory devices may include post-package repair (PPR) technology to address such faults. For example, PPR enables a memory controller to remap a faulty row of the memory device to a functional spare row of the memory device. A "hard" PPR (HPPR) permanently remaps an access from the faulty row to a designated spare row (e.g., by burning row replacement fuses in the memory device). A "soft" PPR (SPPR) temporarily remaps access from the faulty row to the designated spare row.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, firmware, software, or any combination thereof. The material disclosed herein may also be implemented as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of RAM, such as DRAM or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the storage devices that implement such standards may be referred to as DDR-based interfaces.

NV memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

Figure 1:
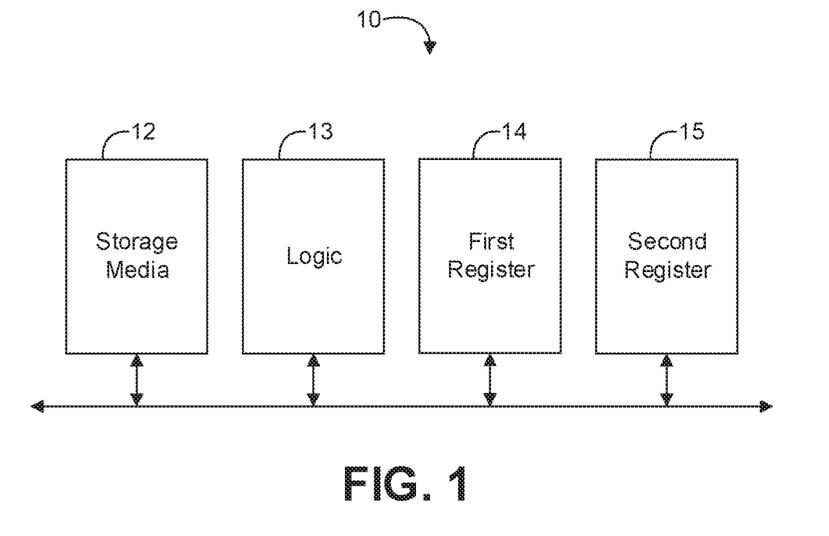
FIG. 1 is a block diagram of an example of an electronic memory apparatus according to an embodiment.

With reference to FIG. 1, an embodiment of an electronic memory apparatus 10 may include storage media 12, and logic 13 communicatively coupled to the storage media 12. In some embodiments, the logic 13 may be configured to determine if a mode is set to one of a first mode or a second mode, perform a soft post package repair in the first mode, and undo the soft post package repair in the second mode. For example, the logic 13 may be further configured to read data from a first location which corresponds to a failed portion of the storage media 12 to a second location which has less capacity than a capacity of the failed portion of the storage media 12, set the mode to the first mode to remap the first location to a spare portion of the storage media 12, and write the data from the second location to the remapped first location of the storage media 12. For example, the second location may correspond to a repair resource such as an available register (e.g., in the apparatus 10, in an attached controller, in an attached processor, etc.) utilized to facilitate the copy.

In some embodiments, the logic 13 may be further configured to set the mode to the second mode after the write if less than all of the data is copied from the failed portion of the storage media 12 to the spare portion of the storage media 12. For example, for the second mode, the logic 13 may be configured to set a source location to redo the read from the first location to the second location and a target location to redo the write to the remapped first location based on an amount of data copied from the failed portion to the spare portion, and remap the first location back to the failed portion of the storage media 12. Some embodiments of the apparatus 10 may further include a first register 14 to store an indication of one of the first mode and the second mode, and/or a second register 15 to store a guard key to enable one or more of the first mode and the second mode. In any of the embodiments herein, the storage media 12 may comprise DRAM (e.g., DDR DRAM, SDRAM, LPDDR DRAM, etc.).

Embodiments of each of the above storage media 12, logic 13, first register 14, second register 15, and other components of the apparatus may be implemented with any suitable memory technology, including hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof.

In some embodiments, the memory components may be located in, or co-located with, various other components, including a controller (e.g., on a same die). Embodiments of a suitable controller may include a general purpose controller, a special purpose controller, a memory controller, a storage controller, a micro-controller, a general purpose processor, a special purpose processor, a central processor unit (CPU), an execution unit, etc. Alternatively, or additionally, all or portions of the controller may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALL-TALK, C++, C# or the like and conventional procedural programming languages, such as the "C" programming language or similar programming languages.

Embodiments of the apparatus 10 may be implemented on a semiconductor apparatus which includes one or more silicon substrates, with a memory circuit coupled to the silicon substrate(s) which includes one or more of the storage media 12, the logic 13, the first register 14, and the second register 15. In some embodiments, the memory circuit may be at least partly implemented in one or more of memory components on the silicon substrate. For example, the memory circuit may include a transistor array and/or other integrated circuit components coupled to the silicon substrate(s) with transistor channel regions that are positioned within the silicon substrate(s). The interface between the memory circuit and the silicon substrate(s) may not be an abrupt junction. The memory circuit may also be considered to include an epitaxial layer that is grown on an initial wafer of the respective silicon substrate(s).

Figure 2A:
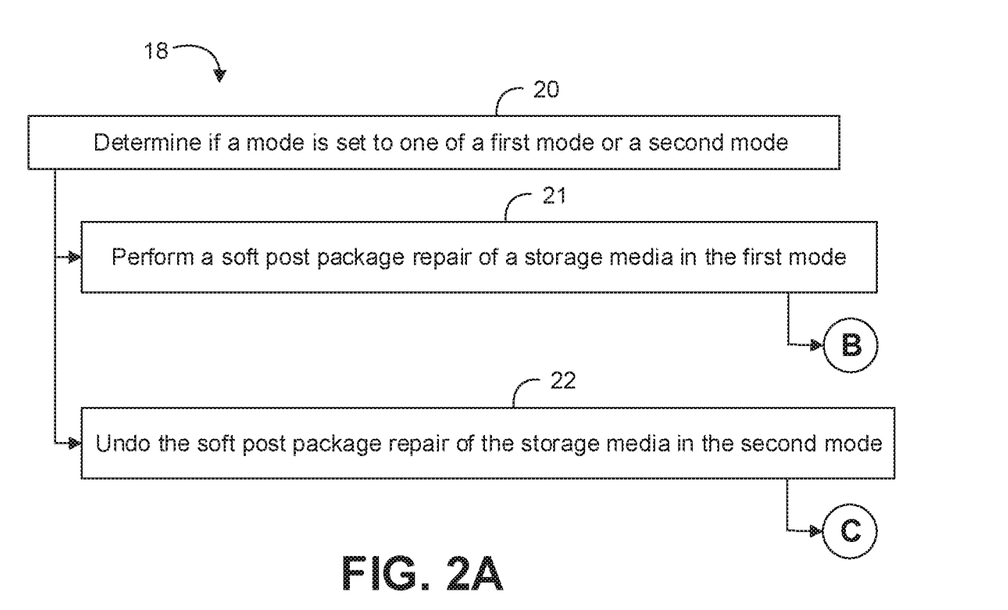
FIGS. 2A to 2C are flowcharts of an example of a method of repairing memory according to an embodiment.
Figure 2B:
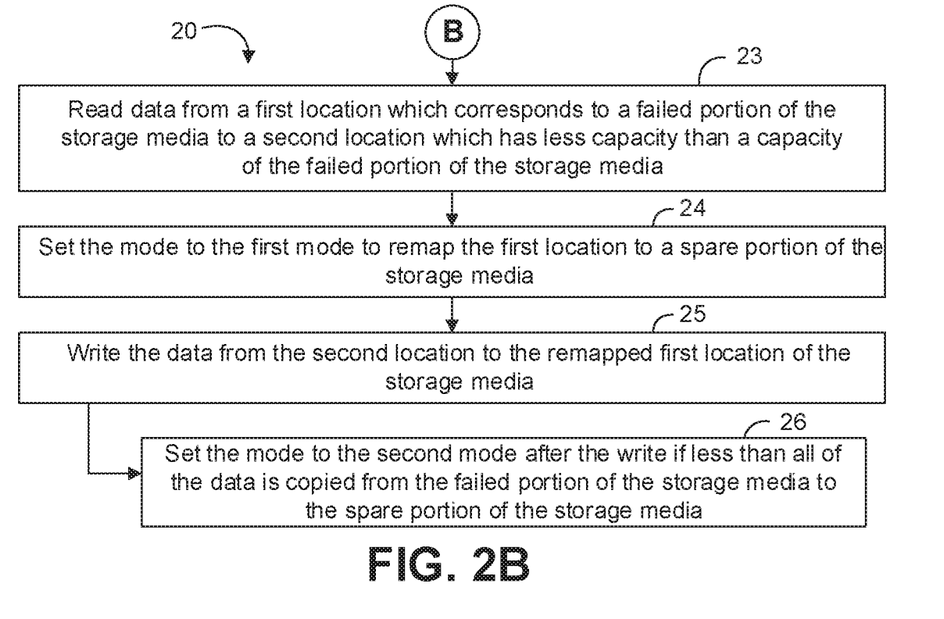
Figure 2C:
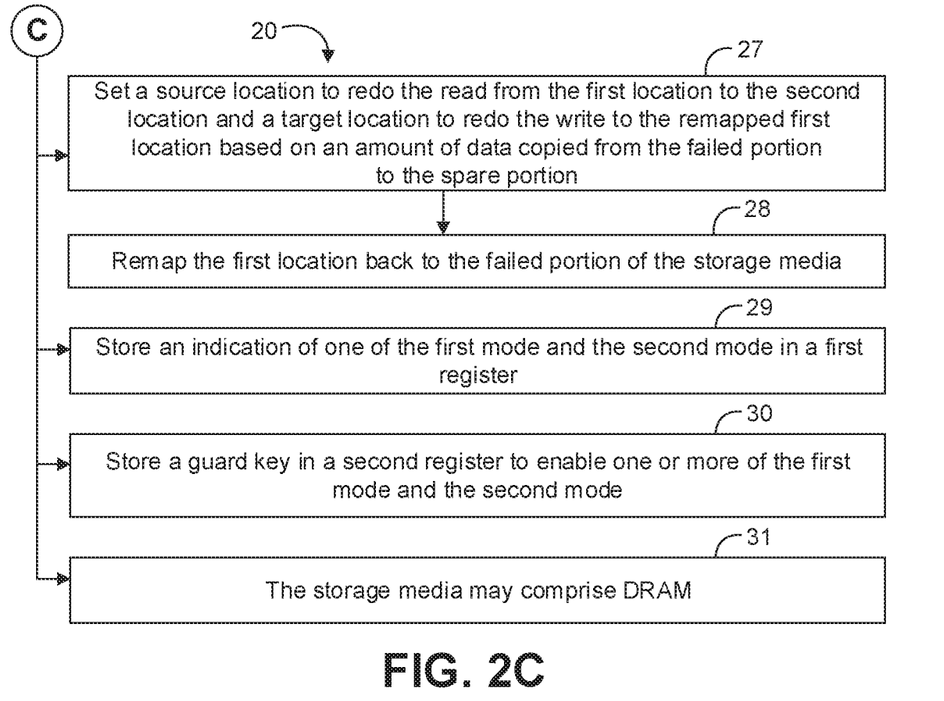

With reference to FIGS. 2A to 2C, an embodiment of a method 18 of repairing memory may include determining if a mode is set to one of a first mode or a second mode at block 20, performing a soft post package repair of a storage media in the first mode at block 21, and undoing the soft post package repair of the storage media in the second mode at block 22. For example, the method 18 may include reading data from a first location which corresponds to a failed portion of the storage media to a second location which has less capacity than a capacity of the failed portion of the storage media at block 23, setting the mode to the first mode to remap the first location to a spare portion of the storage media at block 24, and writing the data from the second location to the remapped first location of the storage media at block 25. The method 18 may further include setting the mode to the second mode after the write if less than all of the data is copied from the failed portion of the storage media to the spare portion of the storage media at block 26. For example, for the second mode, the method 18 may include setting a source location to redo the read from the first location to the second location and a target location to redo the write to the remapped first location based on an amount of data copied from the failed portion to the spare portion at block 27, and remapping the first location back to the failed portion of the storage media at block 28.

Some embodiments of the method 18 may further include storing an indication of one of the first mode and the second mode in a first register at block 29, and/or storing a guard key in a second register to enable one or more of the first mode and the second mode at block 30. In any of the embodiments herein, the storage media may comprises DRAM at block 31.

Embodiments of the method 18 may be implemented in a system, apparatus, computer, device, etc., for example, such as those described herein. More particularly, hardware implementations of the method 18 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 18 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the method 18 may be implemented on a computer readable medium as described in connection with Examples 22 to 28 below. Embodiments or portions of the method 18 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Figure 3:
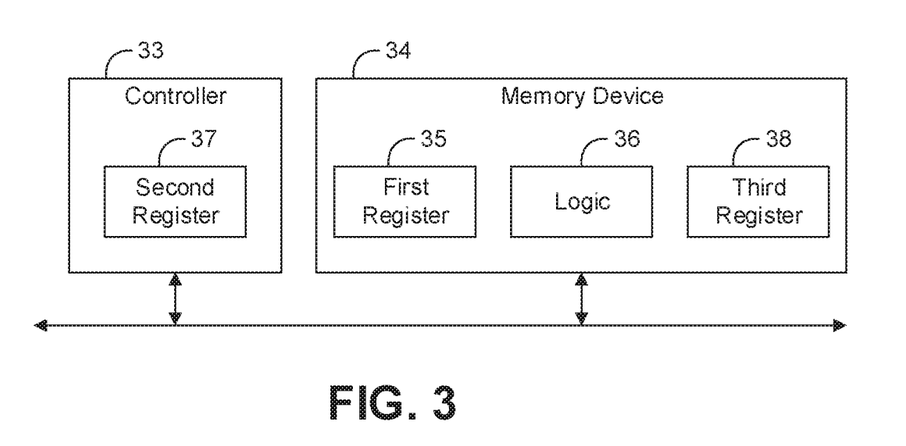
FIG. 3 is a block diagram of an example of an electronic memory system according to an embodiment.

With reference to FIG. 3, an embodiment of an electronic memory system 32 may include a controller 33, and a memory device 34 communicatively coupled to the controller 33. The memory device 34 may be organized with rows including one or more spare rows and the memory device 34 may include a first register 35 to store indications of two or more modes including at least a repair mode and an undo repair mode. The memory device 34 may further include logic 36 to set a field in the first register 35 to indicate a mode which corresponds to one of the repair mode and the undo repair mode, perform a SPPR in the repair mode, and undo the SPPR in the undo repair mode. In some embodiments, the controller 33 may include a second register 37 having a size which is less than a size of a row of the memory device 34, and the logic 36 may be further configured to copy data from a first location which corresponds to a failed row of the memory device 34 to the second register 37, set the mode to the repair mode to remap the first location to a spare row of the memory device 34, and copy the data from the second register 37 to the remapped first location of the memory device 34. In some embodiments, the logic 36 may be further configured to set the field in the first register 35 to indicate the undo repair mode after the copy if less than all of the data is copied from the failed row to the spare row. For example, the logic 36 may be configured to set a bit in the field of the first register 35 to indicate the undo repair mode. For the undo repair mode, for example, the logic 36 may be configured to store an indication of how much data has been copied from the failed row to the spare row, and map the first location back to the failed row of the memory device 34. Some embodiments may further include a third register 38 to store a guard key to enable one or more of the repair mode and the undo repair mode. In any of the embodiments herein, the memory device 34 may comprise DRAM.

Embodiments of the controller 33, memory device 34, first register 35, logic 36, second register 37, third register 38, and other components of the system 32 may be implemented in a system, apparatus, computer, device, etc., for example, such as those described herein. More particularly, hardware implementations of these components may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the logic 36 may be implemented in one or more modules as a set of logic instructions stored in a machine- or computer-readable storage medium such as RAM, ROM, PROM, firmware, flash memory, etc., to be executed by a processor or computing device. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.). Embodiments of a suitable controller 33 may include a general purpose controller, a special purpose controller, a memory controller, a storage controller, a micro-controller, a general purpose processor, a special purpose processor, a central processor unit (CPU), an execution unit, etc.

Some embodiments may advantageously provide technology for undo/redo of SPPR in DRAMs to copy data from a failed area to a replacement area. Various operations of a DRAM device may detect a failure of a portion of the memory. For example, a read or write access to a memory location may identify a row with failures which can be corrected through error correction code (ECC) technology. If the failures associated with the identified row are persistent or numerous (e.g., in excess of a threshold), the row may be designated for SPPR. For example, a memory controller may issue a SPPR command which designates the failed row.

A problem with conventional SPPR in a running system is that a portion of DRAM must be temporarily allocated which is large enough to facilitate the entire copy of data from the failed row to the replacement row. With a 1 kilobyte (KB) page size, for example, 1 KB per DRAM is allocated. For a rank of x4 DDR5 devices, for example, 8 KB are allocated (e.g., the data for all DRAMs within a rank must be written together, even though only one device is being repaired). In some systems, it is difficult to find the space to store the information for the data copy to accomplish the repair. Moreover, the area of DRAM carved out to temporarily store the data may result in a non-binary sized memory which makes decodes more difficult to eliminate just one row. Some embodiments provide technology to copy a portion of the data at a time, advantageously reducing the amount of temporary memory needed to perform the SPPR.

In some embodiments, the SPPR operation may be performed via an available register in the controller (or CPU) and no temporary DRAM is allocated to the SPPR operation.

Some embodiments provide technology to allow a SPPR repair to be undone, and then redone, so that the data may be copied from a failed row to a replacement row in small pieces. Some data is read from the failed row, then the SPPR is done, followed by writing the data to the repair row. The SPPR is then undone and additional data can then be read. The process continues until all of the data is copied. Advantageously, some embodiments may provide the ability to perform SPPR without carving out a section of memory to store the entire failed row.

Figure 4:
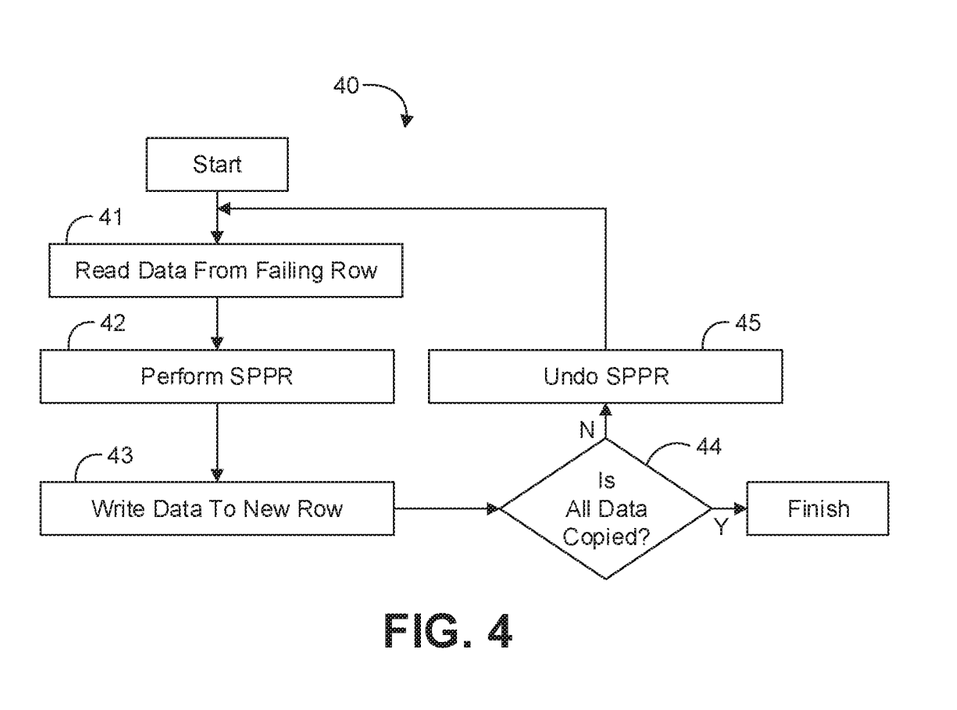
FIG. 4 is a flowchart of another example of a method of repairing memory according to an embodiment.

With reference to FIG. 4, an embodiment of a method 40 of repairing memory may include reading data from a failing row at block 41, performing SPPR at block 42, and writing data to a new row at block 43 (e.g., where the amount of data written is small enough to fit in one or more available registers outside of the memory array). The method 40 may then include determining if all of the data from the failing row has been copied to the new row at block 44. If not, the method 40 may include saving information (e.g., address, size, etc.) to indicate where to restart the SPPR and then undoing the SPPR at block 45. Data is read from the original failed location with the SPPR undone (e.g., or initially, before SPPR has been done at all). Data is written to the repair location while the SPPR is in place.

For example, a sequence to copy data from a failing row M in a DRAM to a new spare row in the DRAM may proceed as follows. A temporary storage area is provided which is smaller than the total amount of data to be moved. As a non-limiting example, a register available inside a CPU may be a suitable repair resource for the temporary storage area. Before performing SPPR, a portion of the data from the failing row M is read and placed in the temporary storage area. Then a SPPR is performed which replaces the failing row M with the spare row in the DRAM. Data is then written from the temporary storage area back to row M in the DRAM, which now writes it to the spare row. Note that these writes occur to the exact same address (e.g., row M) in the DRAM as the failing row data was read from, but because of the SPPR, the failing row is now mapped out and the good spare row is mapped in. If the entire contents of the failing row has not been copied over to the spare, an undo SPPR for row M is performed in order to make the failing row M available again for more reads. The next portion of the data from the failing row M and placed in the temporary storage area. Then SPPR is redone to row M, which remaps the spare row back in. The data from the temporary storage is written back to the DRAM at row M, which again writes it to the spare row. The undo/redo sequence is repeated (undo/read, redo/write) until all of the data is copied from the failing row M to the spare row. In the end, the SPPR is left on and the good spare row is mapped to row M (and contains all of the data). The failing row is mapped out and inaccessible.

Figure 5:
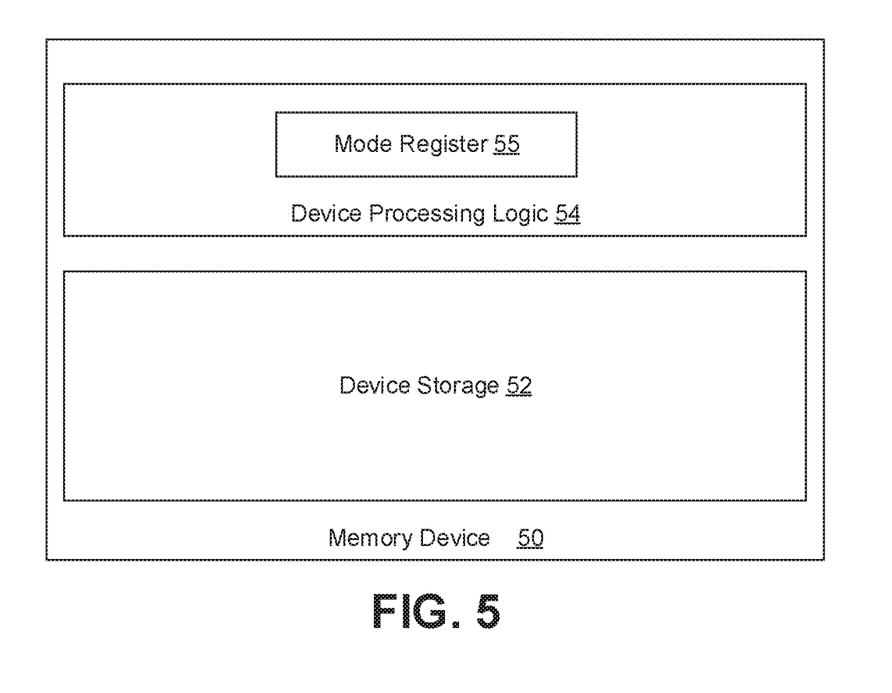
FIG. 5 is a block diagram of an example of a memory device according to an embodiment.

With reference to FIG. 5, a memory device 50 may include device storage 52 and device processing logic 54. The device processing logic 54 may further include a mode register 55. The device storage 52 may include logic to store information in the memory device 50. The logic may include, for example, one or more memory cells that may store the information. The device storage 52 may provide a non-volatile storage and/or volatile storage for the information.

Figure 6:
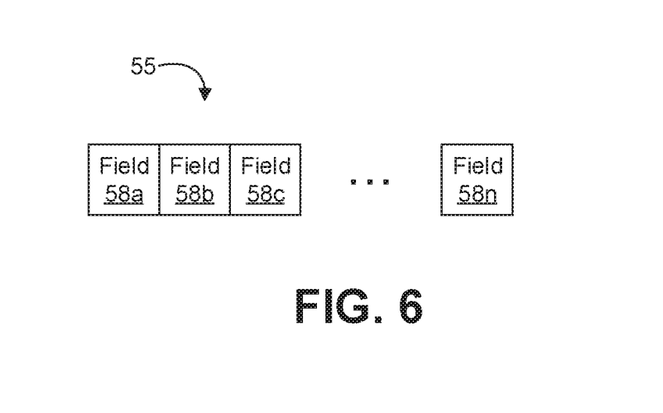
FIG. 6 is a block diagram of an example of a mode register according to an embodiment.

The device processing logic 54 may include logic that may process instances of commands, information, and/or signals (e.g., control signals) that may be acquired by the memory device 50 from a memory controller. The processing may include, for example, executing various instances of the commands that may be transferred from the memory controller to the memory device 50 via a bus or other interface. The mode register 55 may be a register that may be used to specify a mode of operation for one or more portions of the memory device 50. FIG. 6 illustrates an example embodiment of the mode register 55.

With reference to FIG. 6, an embodiment of the mode register 55 may include one or more fields 58a-n (e.g., n>1). A field 58 may be used to specify a mode of operation for the memory device 50. For example, a field 58 may be used to set a mode of operation for the memory device 50 to either the SPPR mode or the undo SPPR mode. It should be noted that a field 58 may be used for other purposes that may be associated with memory device 50. For example, a field 58 may be used to specify a column address strobe (CAS) latency associated with the memory device 50 or a burst length associated with the memory device 50.

The mode register 55 (or another register) may include a field 58 that may be used to enable one or more commands associated with the memory device 50. The field 58 may be sticky in that a value held by the field may remain until a particular event associated with memory device 50 occurs (e.g., the memory device 50 is reset, the memory device 50 is power-cycled, a command changes the value of the field, etc.). For example, the field 58 may hold a value which corresponds to guard key to enable either or both of the SPPR mode and the undo SPPR mode.

For example, suppose the memory device 50 supports execution of the SPPR command A field 58 in mode register 55 may include a bit that when asserted (e.g., set to one) may indicate that execution of the SPPR command is enabled for the memory device 50. After the bit is asserted, an instance of a SPPR command received by the memory device 50 may cause the device processing logic 54 associated with the memory device 50 to execute the instance of the SPPR command. The bit may remain asserted and execution of the SPPR command may remain enabled for the memory device 50 until the memory device 50 is, for example, reset or power-cycled, or until the memory controller de-asserts the bit. The same bit or another bit in the field 58 may also indicate that execution of the undo SPPR command is enabled.

Note that other commands associated with the memory device 50 may be enabled and/or disabled in a similar manner. For example, the memory device 50 may support various vendor specific commands. One or more fields 58 may be used, for example, as described above to disable execution of one or more instances of the supported vendor specific commands that may be acquired by the memory device 50. A field 58 that may be used to disable a command associated with the memory device 50 may be considered sticky in that the command may remain disabled until a certain event associated with the memory device 50 occurs.

An electronic system (e.g., a host system) may execute one or more computer-executable instructions contained in a BIOS that may cause the memory controller to generate a value that when set into the field 58 may cause the SPPR command to be enabled in the memory device 50. In addition, the memory controller may generate an instance of a command (e.g., a mode register write (MRW) command) that may be used to direct the memory device 50 to set the value into the field 58. The instance of the command and the value may be transferred from the memory controller to the memory device 50 via a bus or other interface. The memory device 50 may acquire the instance of the command and the value from the bus. The device processing logic 54 associated with the memory device 50 may process the instance of the command and the value. The processing may include configuring the memory device 50 to enable the SPPR command by, for example, setting the value into the field 58 to indicate that the SPPR command is enabled for the memory device 50.

To perform a SPPR or an undo SPPR, the device processing logic 54 may process an instance of a SPPR command or an instance of an undo SPPR command. An instance of the SPPR command may be processed as follows. The memory controller writes a mode register bit in the memory device to indicate the mode that is being entered (e.g., SPPR mode). The memory controller writes a guard key sequence to a specific mode register to enable function of the SPPR mode (e.g., this step may make it more difficult to enter the SPPR mode by accident). The memory controller issues an activate command with the bank group (if applicable), bank, and row address of the row to be repaired. Any other housekeeping commands may be issued/performed as may be necessary. The memory controller writes the appropriate mode register bits to clear the guard key (e.g., to disable the SPPR mode) and exit the SPPR mode.

Similarly, an instance of the undo SPPR command may be processed where the memory controller writes the appropriate mode register bit(s) to enable the undo SPPR mode and to indicate that the mode is being entered. When the activate command is issued, the undo SPPR operation is performed instead of the SPPR operation. Those skilled in the art will appreciate that other control algorithms can be utilized to undo the SPPR (e.g., a direct control signal), and that utilizing commands/modes/register bits to signify that an undo SPPR Undo is to be done is a non-limiting example. In some embodiments, a mode register may include three bits to respectively indicate that the memory device should 1) perform a HPPR; 2) perform a SPPR; or 3) undo a SPPR. In some embodiments, the undo algorithm may be substantially similar to the SPPR algorithm, with the "undo" bit set instead. In some embodiments, the same guard key may be utilized to enable both the SPPR mode and the undo SPPR mode.

When the activate command is sent, non-limiting example of command parameters include: If only one SPPR resource is available per bank, just the bank group and bank information need be sent; If the implementation is to undo the most recent SPPR to the bank, only the bank group and bank information need be sent (e.g., this does require the memory device to remember which SPPR was the most recent); If the implementation is to undo the most recent SPPR to the entire device, no information need be sent along with the activate command (e.g., this again requires the memory device to remember which SPPR was the most recent); If multiple resources are available per bank, and it is desirable to NOT have the memory device remember the most recent, the activate needs to contain the bank group, the bank, and the row address.

When the SPPR is being undone and redone, the memory device must always map the same repair resource to the target address each time, otherwise the data will not be copied correctly. Some embodiments may disallow any other soft or hard PPR operations during the entire algorithm which copies the data, so that a different PPR does not claim the repair resource in question. Alternately, if there is a requirement to undo and redo multiple target addresses at once, a requirement that the SPPR be done in the same sequence could guarantee the same repair resource is mapped to the target address each time.

For some memory devices, refresh must be maintained in the failed area as well as the repair resource during the process of copying the data, as well as the rest of the memory device. To maintain refresh in the rest of the device, normal refresh commands should be sent at the normal interval. This would potentially not refresh both the failed area and the repair resource of the target row, however. Some embodiments may assure that the activate commands are done frequently enough in the process of reading the failed area and writing the repair area to keep both areas refreshed.

In some cases, a repair resource might span multiple rows. For example, a repair resource might repair two or more rows at a time. If this is the case, the host controller would be required to know this mapping information and copy over all rows that will be modified by the SPPR. Commands other than activate commands may additionally or alternatively be used to perform the SPPR and/or undo SPPR. Given the benefit of the present application, those skilled in the art would appreciate how to extend the various embodiments to those other implementations.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 7:
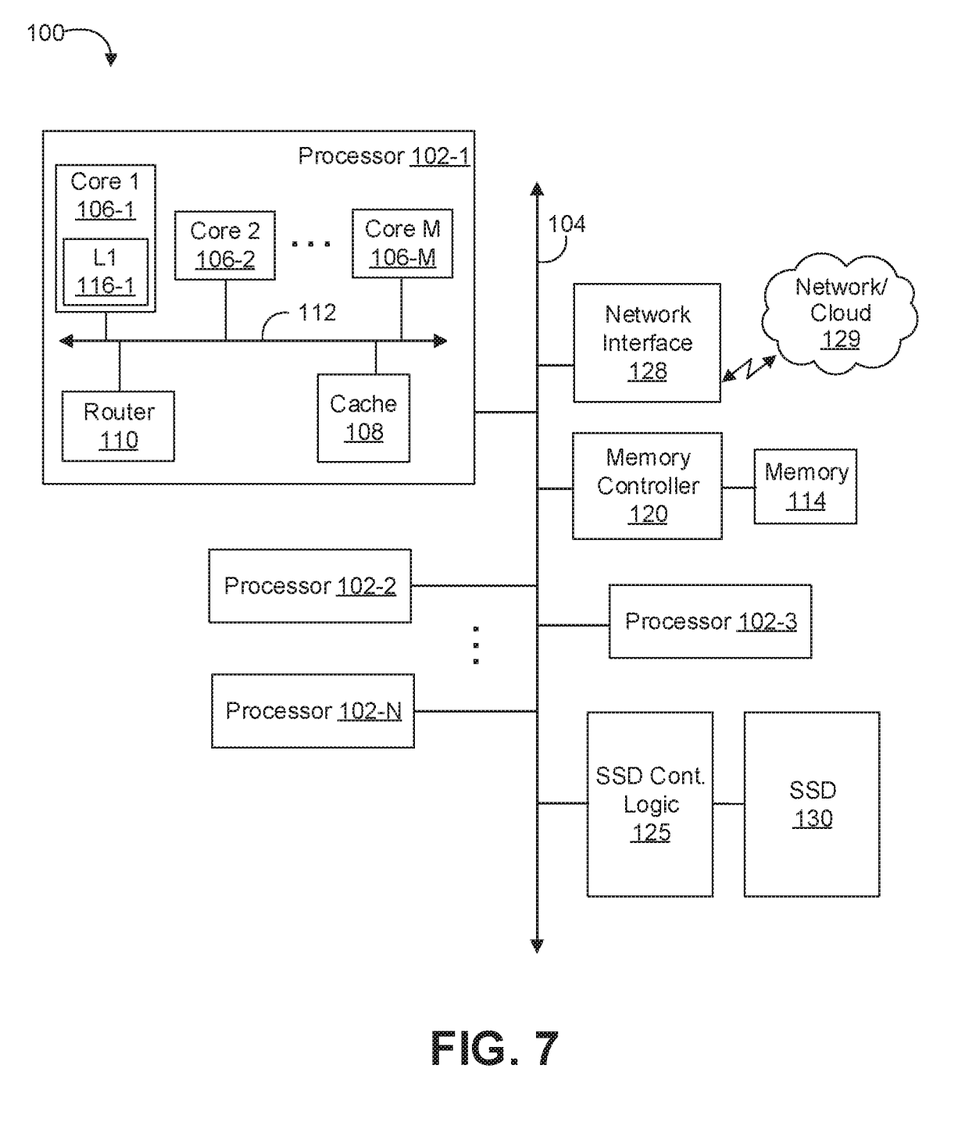
FIG. 7 is a block diagram of an example of a computing system according to an embodiment.

Turning now to FIG. 7, an embodiment of a computing system 100 may include one or more processors 102-1 through 102-N (generally referred to herein as "processors 102" or "processor 102"). The processors 102 may communicate via an interconnection or bus 104. Each processor 102 may include various components some of which are only discussed with reference to processor 102-1 for clarity. Accordingly, each of the remaining processors 102-2 through 102-N may include the same or similar components discussed with reference to the processor 102-1.

In some embodiments, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), memory controllers, or other components.

In some embodiments, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that is utilized by one or more components of the processor 102-1, such as the cores 106. For example, the cache 108 may locally cache data stored in a memory 114 for faster access by the components of the processor 102. As shown in FIG. 7, the memory 114 may be in communication with the processors 102 via the interconnection 104. In some embodiments, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 7, memory 114 may be coupled to other components of system 100 through a memory controller 120. Memory 114 may include volatile memory and may be interchangeably referred to as main memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

The system 100 may communicate with other devices/systems/networks via a network interface 128 (e.g., which is in communication with a computer network and/or the cloud 129 via a wired or wireless interface). For example, the network interface 128 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 129.

System 100 may also include a storage device such as a SSD device 130 coupled to the interconnect 104 via SSD controller logic 125. Hence, logic 125 may control access by various components of system 100 to the SSD device 130. Furthermore, even though logic 125 is shown to be directly coupled to the interconnection 104 in FIG. 7, logic 125 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), etc.) with one or more other components of system 100 (for example where the storage bus is coupled to interconnect 104 via some other logic like a bus bridge, chipset, etc.) Additionally, logic 125 may be incorporated into memory controller logic or provided on a same integrated circuit (IC) device in various embodiments (e.g., on the same circuit board device as the SSD device 130 or in the same enclosure as the SSD device 130).

Furthermore, logic 125 and/or SSD device 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein), including the cores 106, interconnections 104 or 112, components outside of the processor 102, SSD device 130, SSD bus, SATA bus, logic 125, etc., to sense variations in various factors affecting power/thermal behavior of the system/platform, such as temperature, operating frequency, operating voltage, power consumption, and/or inter-core communication activity, etc.

Advantageously, the memory controller 120, the memory 114, or other memory components communicatively coupled to the processors 102, may include technology to implement one or more aspects of the apparatus 10 (FIG. 1), the method 18 (FIGS. 2A to 2C), the system 32 (FIG. 3), the method 40 (FIG. 4), the memory device 50 (FIG. 5), or the mode register 55 (FIG. 6), and/or any of the features discussed herein. In some embodiments, the memory 114 may include various types of synchronous dynamic random access memory (SDRAM), such as double data rate (DDR) SDRAM. As the capacity of DDR SDRAM included in computing devices has grown, so too has the failure rate of DDR SDRAM modules. Some DDR SDRAM modules may be configured to as dynamic inline memory modules (DIMMs). Each DIMM may comprise at least one memory chip, which includes rows and columns of dynamic RAM cells. The memory controller 120, which is coupled to the processors 102, issues memory transfer requests to read or write data to or from a particular address of the memory 114. The memory controller 120 may also issue other non-data transfer commands to the memory 114, such as SPPR commands and undo SPPR commands as described herein.

Additional Notes and Examples

Example 1 includes an electronic memory apparatus, comprising storage media, and logic communicatively coupled to the storage media, the logic to determine if a mode is set to one of a first mode or a second mode, perform a soft post package repair in the first mode, and undo the soft post package repair in the second mode.

Example 2 includes the apparatus of Example 1, wherein the logic is further to read data from a first location which corresponds to a failed portion of the storage media to a second location which has less capacity than a capacity of the failed portion of the storage media, set the mode to the first mode to remap the first location to a spare portion of the storage media, and write the data from the second location to the remapped first location of the storage media.

Example 3 includes the apparatus of Example 2, wherein the logic is further to set the mode to the second mode after the write if less than all of the data is copied from the failed portion of the storage media to the spare portion of the storage media.

Example 4 includes the apparatus of Example 3, wherein for the second mode the logic is further to set a source location to redo the read from the first location to the second location and a target location to redo the write to the remapped first location based on an amount of data copied from the failed portion to the spare portion, and remap the first location back to the failed portion of the storage media.

Example 5 includes the apparatus of any of Examples 1 to 4, further comprising a first register to store an indication of one of the first mode and the second mode.

Example 6 includes the apparatus of Example 5, further comprising a second register to store a guard key to enable one or more of the first mode and the second mode.

Example 7 includes the apparatus of any of Examples 1 to 6, wherein the storage media comprises dynamic random access memory.

Example 8 includes an electronic memory system, comprising a controller, and a memory device communicatively coupled to the controller, wherein the memory device is organized with rows including one or more spare rows, the memory device comprising a first register to store indications of two or more modes including at least a repair mode and an undo repair mode, and logic to set a field in the first register to indicate a mode which corresponds to one of the repair mode and the undo repair mode, perform a soft post package repair in the repair mode, and undo the soft post package repair in the undo repair mode.

Example 9 includes the system of Example 8, wherein the controller further comprises a second register having a size which is less than a size of a row of the memory device, and wherein the logic is further to copy data from a first location which corresponds to a failed row of the memory device to the second register, set the mode to the repair mode to remap the first location to a spare row of the memory device, and copy the data from the second register to the remapped first location of the memory device.

Example 10 includes the system of Example 9, wherein the logic is further to set the field in the first register to indicate the undo repair mode after the copy if less than all of the data is copied from the failed row to the spare row.

Example 11 includes the system of Example 10, wherein for the undo repair mode the logic is further to store an indication of how much data has been copied from the failed row to the spare row, and map the first location back to the failed row of the memory device.

Example 12 includes the system of any of Examples 9 to 11, further comprising a third register to store a guard key to enable one or more of the repair mode and the undo repair mode.

Example 13 includes the system of any of Examples 8 to 12, wherein the logic is further to set a bit in the field of the first register to indicate the undo repair mode.

Example 14 includes the system of any of Examples 8 to 13, wherein the memory device comprises dynamic random access memory.

Example 15 includes a method of repairing memory, comprising determining if a mode is set to one of a first mode or a second mode, performing a soft post package repair of a storage media in the first mode, and undoing the soft post package repair of the storage media in the second mode.

Example 16 includes the method of Example 15, further comprising reading data from a first location which corresponds to a failed portion of the storage media to a second location which has less capacity than a capacity of the failed portion of the storage media, setting the mode to the first mode to remap the first location to a spare portion of the storage media, and writing the data from the second location to the remapped first location of the storage media.

Example 17 includes the method of Example 16, further comprising setting the mode to the second mode after the write if less than all of the data is copied from the failed portion of the storage media to the spare portion of the storage media.

Example 18 includes the method of Example 17, wherein for the second mode the method further comprises setting a source location to redo the read from the first location to the second location and a target location to redo the write to the remapped first location based on an amount of data copied from the failed portion to the spare portion, and remapping the first location back to the failed portion of the storage media.

Example 19 includes the method of Example 15, further comprising storing an indication of one of the first mode and the second mode in a first register.

Example 20 includes the method of Example 19, further comprising storing a guard key in a second register to enable one or more of the first mode and the second mode.

Example 21 includes the method of Example 15, wherein the storage media comprises dynamic random access memory.

Example 22 includes at least one non-transitory one machine readable medium comprising a plurality of instructions that, in response to being executed on a computing device, cause the computing device to determine if a mode is set to one of a first mode or a second mode, perform a soft post package repair of a storage media in the first mode, and undo the soft post package repair of the storage media in the second mode.

Example 23 includes the at least one non-transitory one machine readable medium of Example 22, comprising a plurality of further instructions that, in response to being executed on the computing device, cause the computing device to read data from a first location which corresponds to a failed portion of the storage media to a second location which has less capacity than a capacity of the failed portion of the storage media, set the mode to the first mode to remap the first location to a spare portion of the storage media, and write the data from the second location to the remapped first location of the storage media.

Example 24 includes the at least one non-transitory one machine readable medium of Example 23, comprising a plurality of further instructions that, in response to being executed on the computing device, cause the computing device to set the mode to the second mode after the write if less than all of the data is copied from the failed portion of the storage media to the spare portion of the storage media.

Example 25 includes the at least one non-transitory one machine readable medium of Example 24, comprising a plurality of further instructions that for the second mode, in response to being executed on the computing device, cause the computing device to set a source location to redo the read from the first location to the second location and a target location to redo the write to the remapped first location based on an amount of data copied from the failed portion to the spare portion, and remap the first location back to the failed portion of the storage media.

Example 26 includes the at least one non-transitory one machine readable medium of any of Examples 22 to 25, comprising a plurality of further instructions that, in response to being executed on the computing device, cause the computing device to storing an indication of one of the first mode and the second mode in a first register.

Example 27 includes the at least one non-transitory one machine readable medium of Example 26, comprising a plurality of further instructions that, in response to being executed on the computing device, cause the computing device to storing a guard key in a second register to enable one or more of the first mode and the second mode.

Example 28 includes the at least one non-transitory one machine readable medium of any of Examples 22 to 27, wherein the storage media comprises dynamic random access memory.

Example 29 includes a memory repair apparatus, comprising means for determining if a mode is set to one of a first mode or a second mode, means for performing a soft post package repair of a storage media in the first mode, and means for undoing the soft post package repair of the storage media in the second mode.

Example 30 includes the apparatus of Example 29, further comprising means for reading data from a first location which corresponds to a failed portion of the storage media to a second location which has less capacity than a capacity of the failed portion of the storage media, means for setting the mode to the first mode to remap the first location to a spare portion of the storage media, and means for writing the data from the second location to the remapped first location of the storage media.

Example 31 includes the apparatus of Example 30, further comprising means for setting the mode to the second mode after the write if less than all of the data is copied from the failed portion of the storage media to the spare portion of the storage media.

Example 32 includes the apparatus of Example 31, wherein for the second mode the method further comprises means for setting a source location to redo the read from the first location to the second location and a target location to redo the write to the remapped first location based on an amount of data copied from the failed portion to the spare portion, and means for remapping the first location back to the failed portion of the storage media.

Example 33 includes the apparatus of any of Examples 29 to 32, further comprising means for storing an indication of one of the first mode and the second mode in a first register.

Example 34 includes the apparatus of Example 33, further comprising means for storing a guard key in a second register to enable one or more of the first mode and the second mode.

Example 35 includes the apparatus of any of Examples 29 to 34, wherein the storage media comprises dynamic random access memory. The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An electronic memory apparatus, comprising:
storage media; and
logic communicatively coupled to the storage media, the logic to:
copy a portion of data within the storage media from a first location which corresponds to a failed portion of the storage media to a second location which has less capacity than a capacity of the failed portion of the storage media,
set a mode to a first mode to perform a soft post package repair to remap the first location to a spare portion of the storage media,
set the mode to a second mode to write the data from the second location to the remapped first location of the storage media to undo the soft post package repair, and
copy a remaining portion of the data from the first location which corresponds to the failed portion of the storage media to the second location.

2. The apparatus of claim 1, wherein the logic is further to:
set the mode to the second mode after the write if less than all of the data is copied from the failed portion of the storage media to the spare portion of the storage media.

3. The apparatus of claim 2, wherein for the second mode the logic is further to:
set a source location to redo the read from the first location to the second location and a target location to redo the write to the remapped first location based on an amount of data copied from the failed portion to the spare portion; and
remap the first location back to the failed portion of the storage media.

4. The apparatus of claim 1, further comprising:
a first register to store an indication of one of the first mode and the second mode.

5. The apparatus of claim 4, further comprising:
a second register to store a guard key to enable one or more of the first mode and the second mode.

6. The apparatus of claim 1, wherein the storage media comprises dynamic random access memory.

7. An electronic memory system, comprising:
a controller; and
a memory device communicatively coupled to the controller, wherein the memory device is organized with rows including one or more spare rows, the memory device comprising a first register to store indications of two or more modes including at least a repair mode and an undo repair mode, and logic to:
copy a portion of data from a first location which corresponds to a failed row of the memory device to a second register, wherein the controller comprises the second register that has a size which is less than a size of a row of the memory device,
set a field in the first register to indicate the repair mode to perform a soft post package repair to remap the first location to a spare row of the memory device,
set the field in the first register to indicate the undo repair mode to copy the data from the second register to the remapped first location of the memory device to undo the soft post package repair, and
copy a remaining portion of the data from the first location which corresponds to the failed row of the memory device to the second register.

8. The system of claim 7, wherein the logic is further to:
set the field in the first register to indicate the undo repair mode after the copy if less than all of the data is copied from the failed row to the spare row.

9. The system of claim 8, wherein for the undo repair mode the logic is further to:
store an indication of how much data has been copied from the failed row to the spare row; and
map the first location back to the failed row of the memory device.

10. The system of claim 7, further comprising:
a third register to store a guard key to enable one or more of the repair mode and the undo repair mode.

11. The system of claim 7, wherein the logic is further to:
set a bit in the field of the first register to indicate the undo repair mode.

12. The system of claim 7, wherein the memory device comprises dynamic random access memory.

13. A method of repairing memory, comprising:
copying data within storage media from a first location which corresponds to a failed portion of storage media to a second location which has less capacity than a capacity of the failed portion of the storage media;
setting a mode to a first mode to perform a soft post package repair of the storage media to remap the first location to a spare portion of the storage media; and
setting the mode to a second mode to write the data from the second location to the remapped first location of the storage media to undo the soft post package repair of the storage media; and
copying a remaining portion of the data from the first location which corresponds to the failed portion of the storage media to the second location.

14. The method of claim 13, further comprising:
setting the mode to the second mode after the write if less than all of the data is copied from the failed portion of the storage media to the spare portion of the storage media.

15. The method of claim 14, wherein for the second mode the method further comprises:
setting a source location to redo the read from the first location to the second location and a target location to redo the write to the remapped first location based on an amount of data copied from the failed portion to the spare portion; and
remapping the first location back to the failed portion of the storage media.

16. The method of claim 13, further comprising:
storing an indication of one of the first mode and the second mode in a first register.

17. The method of claim 16, further comprising:
storing a guard key in a second register to enable one or more of the first mode and the second mode.

* * * * *